United States Patent
Kobayashi et al.

[11] Patent Number: 6,074,442
[45] Date of Patent: *Jun. 13, 2000

[54] METHOD OF SEPARATING SLICE BASE MOUNTING MEMBER FROM WAFER AND JIG ADAPTED THEREFOR

[75] Inventors: Masayuki Kobayashi; Shigetoshi Shimoyama; Nakaji Miura, all of Nishi-shirakawa-gun, Japan

[73] Assignee: Shin-Etsu Handotai Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/547,107

[22] Filed: Oct. 23, 1995

[30] Foreign Application Priority Data

Oct. 28, 1994 [JP] Japan .................................. 6-289242
Jun. 29, 1995 [JP] Japan .................................. 7-186462

[51] Int. Cl.[7] ........................... H01L 21/30; H01L 21/64; H01L 21/68
[52] U.S. Cl. ........................... 29/25.01; 438/115
[58] Field of Search ............... 29/25.01; 438/115

[56] References Cited

U.S. PATENT DOCUMENTS

| | | |
|---|---|---|
| 4,488,930 | 12/1984 | Koe . |
| 4,510,672 | 4/1985 | Yakura . |
| 4,949,700 | 8/1990 | Ebashi . |
| 5,154,873 | 10/1992 | Sato et al. . |
| 5,240,882 | 8/1993 | Satoh et al. . |
| 5,427,644 | 6/1995 | Nagatsuka et al. . |
| 5,524,604 | 6/1996 | Honda . |
| 5,571,040 | 11/1996 | Kawaguchi et al. . |

FOREIGN PATENT DOCUMENTS

| | | |
|---|---|---|
| 0 506 052 A1 | 9/1992 | European Pat. Off. . |
| 7-205140 | 8/1995 | Japan . |

*Primary Examiner*—David E. Graybill
*Attorney, Agent, or Firm*—Oliff & Berridge, PLC

[57] ABSTRACT

An method of separating a slice base mounting member such as a carbon member from sliced wafers, and an jig which is used for treating the wafers in the method, are disclosed. The method of separating a slice base mounting member from sliced wafers comprises the steps of; supporting a plurality of wafers having at least a slice base mounting member in a stacked state, and separating the slice base mounting member from the stacked wafers.

16 Claims, 10 Drawing Sheets

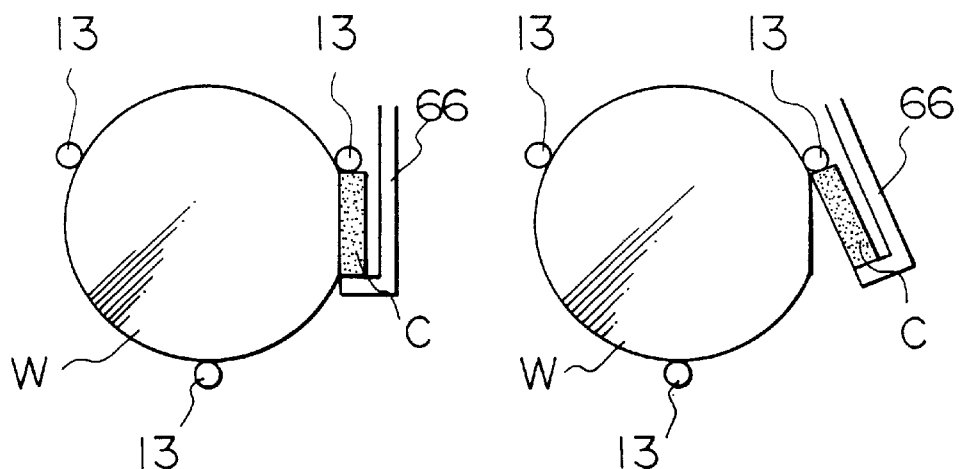
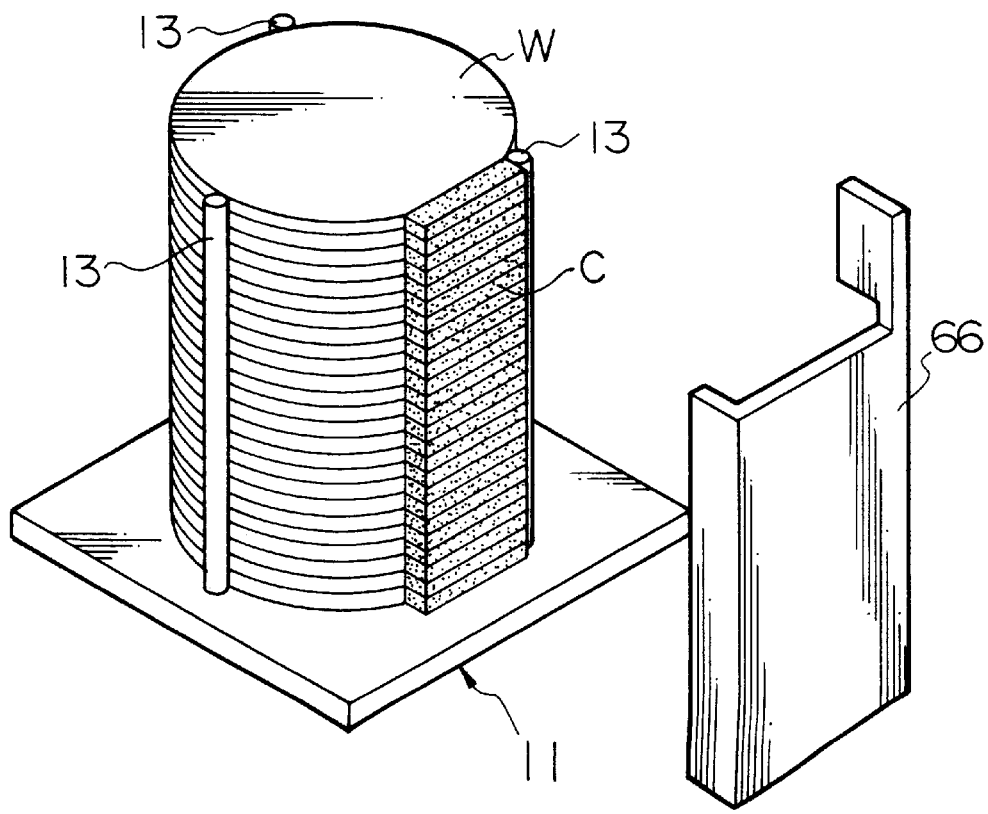

METHOD OF SEPARATING SLICE BASE MOUNTING MEMBER FROM WAFER AND JIG ADAPTED THEREFOR

BACKGROUND OF THE INVENTION

1. Field of the Invention

The present invention relates to a method of separating a slice base mounting member, e.g., of carbon or the like, from sliced wafers, and to a jig for treating the wafers, which is adapted to a carrier for transferring the wafers and for separating the slice base mounting member from the wafers in the method.

2. Description of Related Art

Generally, in order to manufacture semiconductor wafers by slicing an ingot of silicon or the like, a slice base mounting member (a supporting member for slicing) made of carbon or the like is fixed to the ingot with an adhesive, and the ingot with the slice base mounting member is sliced by an inner diameter saw slicing machine, a wire saw slicing machine or the like to form a large number of wafers, and then the slice base mounting member is removed from the sliced wafers.

In the conventional process to separate the slice base mounting member from the sliced wafers, a number of containers 110, in each of which a number of wafers W with slice base mounting members C are arranged and stood at uniform gaps so that the wafer surfaces thereof faced sideways, are arranged in a basket 111 for containing the containers 110, as shown in FIG. 14. The whole basket 111 having the containers 110 therein is immersed into a chemical liquid or the like in a separation tank 112, and thereby the slice base mounting members C are separated from the wafers W.

However, such a conventional process has the following problems.

That is, in such a process, because it is necessary to wait until the chemical liquid or the like sufficiently infiltrates into the adhesive which exists on the interface between the wafers W and the slice base mounting members C so that the slice base mounting members are naturally separated from the wafers W, there is a problem of taking a long time for separation of the slice base mounting members C. Because the wafers W are arranged and stood in each container 110 and the containers 110 are horizontally lined up in parallel in the basket 111, when the installation area for the separation tank 112 is restrictive, the number of wafers W to which separation treatment can be performed at a time is restricted. Therefore, there is also a problem of an inefficient treatment.

On the other hand, in order to solve the problem, when a plurality of containers 110 are stacked in parallel, it is possible to increase the number of wafers W to which separation treatment can be performed at a time. However, because there are spacings between adjacent wafers W in each container 110, during the separation treatment, the slice base mounting members such as carbon members which were separated from the wafers W in the upper side gets into the spaces between the wafers W in the lower side to adhere to the front and rear surfaces of the wafers W again. Accordingly, because another considerable time for removing the re-adhered slice base mounting members, e.g., of carbon, is required and thereby accumulation of members is caused, the problems of aggravation of operating efficiency of the whole separating apparatus including the next cleaning apparatus are encountered.

SUMMARY OF THE INVENTION

The present invention was developed in view of the above-described problems.

An object of the present invention is to provide a method of separating a slice base mounting member from sliced wafers, which enables an improvement in throughput of the separation treatment, an improvement in operating efficiency of the separating apparatus including a next cleaning apparatus, and reduction of the installation area for the separation tank, and which are suitable for automation and can prevent re-adhesion of the slice base mounting member such as a carbon member or the like.

Another object of the present invention is to provide an improved jig for treating the wafers, which is adapted to a carrier for transferring the wafers and for separating the slice base mounting member from the wafers in the method.

In accordance with one aspect of the present invention, the method of separating a slice base mounting member from sliced wafers comprises the steps of; supporting a plurality of wafers having at least a slice base mounting member in a stacked state, and separating the slice base mounting member from the stacked wafers.

In the above-described method, because the slice base mounting member is separated from the wafers supported in a stacked state, it is possible not only to suppress the increase in area for installation of the separation tank but to improve the throughput of the separation treatment, by making the separation tank deep.

In the above-described method, because the sliced wafers are supported in a stacked state, the slice base mounting member such as a carbon member which was separated from the wafers W does not get into the spaces between the wafers W, therefore, the problem of re-adhesion of the separated slice base mounting member does not occur. Accordingly, it is possible to improve the operating efficiency of the separating apparatus.

Preferably, each of the stacked wafers has a slice base mounting member which is arranged in substantially the same direction. The method may further comprise a step of immersing the supported and stacked wafers in a separating liquid such as a chemical liquid, after the supporting step. Further, the method may also comprise a step of giving an impact to an adhesive between the wafers and the slice base mounting member by supplying a compressed air in the separating liquid. The method may also comprise a step of giving an impact to an adhesive between the wafers and the slice base mounting member by applying an ultrasonic wave to the separating liquid.

Accordingly, it is possible to increase the number of wafers treated per unit time, and to improve the throughput of the separation treatment.

The method may comprise the steps of; nipping the entirety of the slice base mounting member by a nipping device in a direction parallel to the wafer surfaces, and moving the nipping device with the slice base mounting member in a direction parallel to the wafer surfaces to separate from the wafers. Further, the method may also comprise the steps of; pressing a side surface of the entirety of the slice base mounting member, by a pressing device while placing the opposite side surface of the entirety of the slice base mounting member against a fixed portion; and moving the slice base mounting member in a direction parallel to the wafer surfaces to separate from the wafers. Preferably, the method further comprises the steps of; taking the wafers out of the separating liquid one by one after the separating step, cleaning the taken-out wafers, and drying the cleaned wafers. The stacked wafers taken out of the separating liquid are preferably transferred one by one by a suction device which can suck to support the top one of the stacked wafers on the lower surface thereof.

In the method of the present invention, the plurality of supported wafers may be stacked so that the slice base mounting members which are separated from one another are arranged in the same direction and adjacent wafer surfaces are in contact with each other. In this case, the method may further comprise the steps of; nipping the entirety of the slice base mounting members by a nipping device in a direction parallel to the wafer surfaces, and moving the nipping device with the slice base mounting members in a direction parallel to the wafer surfaces to separate from the wafers. Further, the method may also comprise the steps of; pressing a side surface of the entirety of the slice base mounting members, by a pressing device while placing the opposite side surface of the entirety of the slice base mounting members against a fixed portion; and moving the slice base mounting members in a direction parallel to the wafer surfaces to separate from the wafers.

The above method of the present invention can be also applied for separating the slice base mounting member to the sliced wafers, in which the sliced wafers are connected with one another through the slice base mounting member which has been incompletely cut when an ingot was sliced.

In such methods, because the slice base mounting member is compulsorily separated, it is possible to increase the number of wafers treated per unit time, and to improve the throughput of the separation treatment. It is also possible to suppress the increase in installation area for the separation tank. Because the plurality of wafers are stacked so that the separated slice base mounting members are arranged in the same direction and adjacent wafer surfaces are in contact with each other, or because the slice base mounting member is like a lump, the separated slice base mounting member does not adhere on the wafer surfaces again.

In the method of the present invention, because the entirety of the slice base mounting member is separated in a direction parallel to the wafer surfaces, not perpendicular to the wafer surfaces, it is possible to prevent chipping of wafers.

If a plurality of wafers which are separated from one another, are stacked so that the slice base mounting members are arranged in the same direction and adjacent wafer surfaces are in contact with each other, a part of the slice base mounting member may overlap on some wafers by wafers being slipped circumferentially or radially. In this condition, when pressing the slice base mounting member in a direction perpendicular to the wafer surfaces, some wafers might be chipped and separation of the slice base mounting member might be incompletely carried out. On the contrary, according to the present invention, there is no problem with respect to the above-described matter because the slice base mounting member is separated in a direction parallel to the wafer surfaces.

In accordance with another aspect of the present invention, the jig for treating the wafers comprises: a bottom plate on which a plurality of wafers having a diameter can be supported in a stacked state; a guide means stood on the bottom plate, for guiding the wafers in a stacked state; and a handle attached to the bottom plate. For example, the plurality of guide rods may be stood on the bottom plate, which are arranged on the circumference of a circle having a diameter slightly larger than that of the wafers.

In the above-described jig, because the slice base mounting member is separated from the stacked and supported wafers, it is possible not only to suppress the increase in installation area of the separation tank but to improve the throughput of the separation treatment, by making the separation tank deep.

In the above-described jig, because the wafers are supported in a stacked state, the slice base mounting member which was separated from the wafer does not get into the spaces between the wafers, therefore, the problem of re-adhesion of the slice base mounting member does not occur. Accordingly, it is possible to improve the operating efficiency of the apparatus. Furthermore, because a handle is attached to the jig for treating the wafers, it is possible to handle the jig by using the handle. Therefore, the jig is suitable for automation.

In the above-described jig for treating the wafers, because the wafers are guided by the guide rods when the wafers are supported in a stacked state, it is possible to easily support the wafers.

Preferably, in the above-described jig, the bottom plate has a cutout in a side thereof, in which the slice base mounting member attached to the wafers can exist in plan. Accordingly, separation of the slice base mounting member from the wafers can be easily carried out by a suitable mechanical separating device through the cutout. In the jig, the bottom plate preferably has a through hole at approximately the center thereof, through which a wafer lifting device can be inserted upwardly. Accordingly, the wafers can be taken out of the separating liquid one by one after the separating step, and then can be transferred to the next cleaning step. In the vicinity of each corner of the bottom plate, a plurality of holes for mounting each guide rod can be formed at positions different distances apart from the center of the bottom plate to one another. Such a jig can be used for various types of wafers having different diameters. The jig may comprise a pair of handles, wherein each handle comprises a pair of vertical members and a horizontal member constructed between the upper portions of the pair of vertical members, and the horizontal member has a cutout formed in the inner side thereof to prevent interfering with the wafers when the wafers are placed on the bottom plate.

In accordance with a further aspect of the present invention, the method of separating a slice base mounting member from sliced wafers comprises the steps of: preparing a jig for treating wafers adapted for separating a slice base mounting member from sliced wafers comprising; a bottom plate having a cutout in a side thereof, on which a plurality of wafers having a diameter can be supported in a stacked state, a plurality of guide rods stood on the bottom plate, which are arranged on the circumference of a circle having a diameter slightly larger than that of the wafers, and a handle attached to the bottom plate; supporting a plurality of wafers having at least a slice base mounting member on the bottom plate of the jig, in a stacked state so that the slice base mounting member attached to the wafers exists in the cutout of the bottom plate in plan; and separating the slice base mounting member in the cutout from the stacked wafers by a separating means.

In the above-described method, because the slice base mounting member exists in the cutout in plan, it is possible to easily and efficiently separate the slice base mounting member by using the separating means in the cutout.

BRIEF DESCRIPTION OF THE DRAWINGS

The present invention will become more fully understood from the detailed description given hereinbelow and the accompanying drawings which are given by way of illustration only, and thus do not limit the present invention, and wherein;

FIG. 10A is a schematic plan view showing the fifth embodiment of the method of the present invention;

FIG. 10B is a schematic plan view for explaining a manner of separation in the fifth embodiment of the method of the present invention;

FIG. 11 is a perspective view of a pulling and stripping member and the like used in the fifth embodiment of the method of the present invention;

DESCRIPTION OF THE PREFERRED EMBODIMENT

Figure 1:
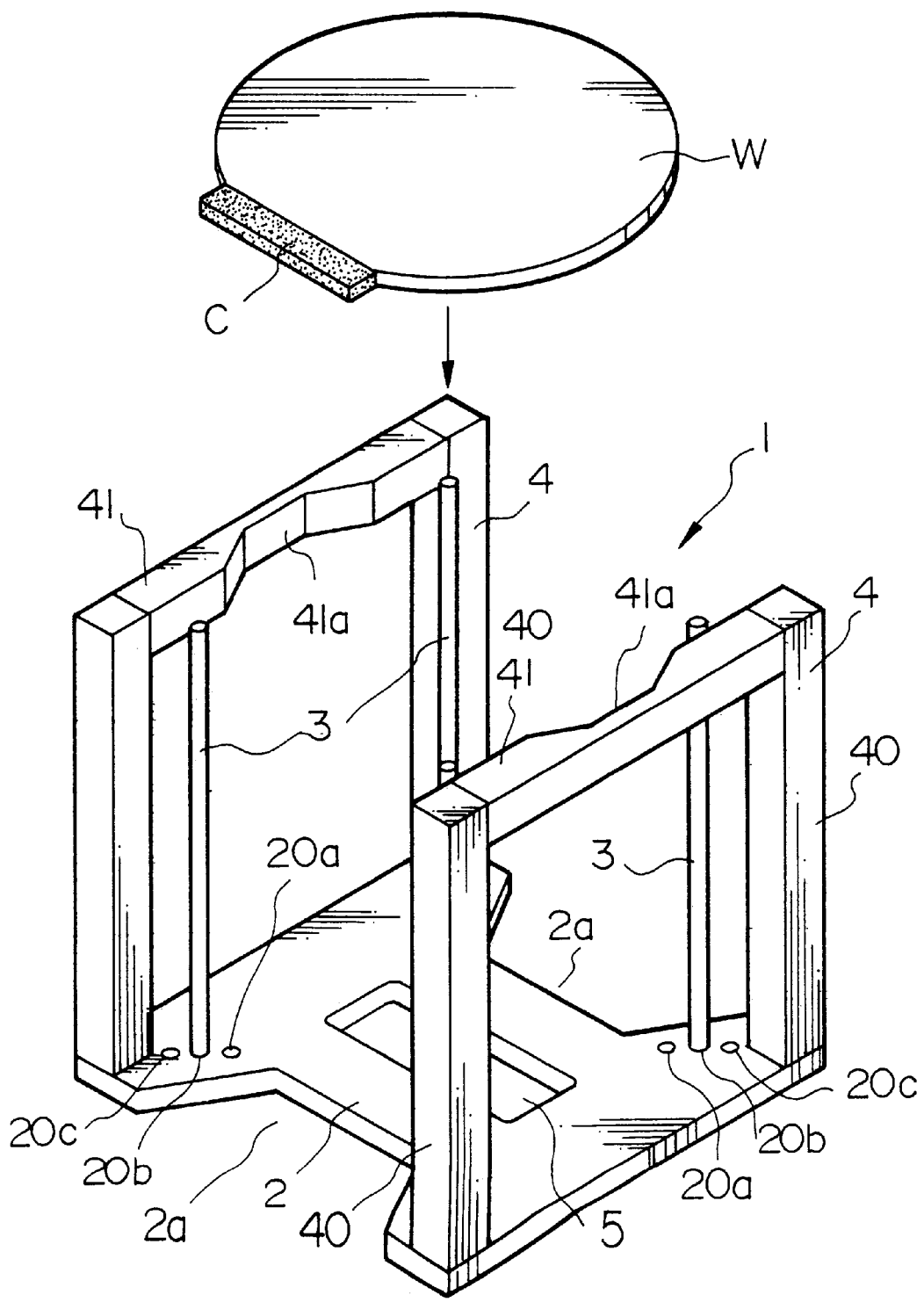
FIG. 1 is a perspective view showing the first embodiment of a carrier of the present invention.

Hereinafter, embodiments of the method of separating the slice base mounting member from wafers according to the present invention will be explained with reference to the drawings. First, an embodiment of a jig for treating the wafers (hereinafter, referred to "a carrier") which is used for transferring and handling the wafers and for separating the slice base mounting member from the wafers in the method, will be explained with reference to FIG. 1.

The carrier 1 which is used for handling wafers W, comprises a bottom plate 2, four guide rods 3, 3, . . . which are stood near the four corner on the bottom plate 2, and two handles 4 and 4 attached to the upper surface of the bottom plate 2.

Figure 2A:
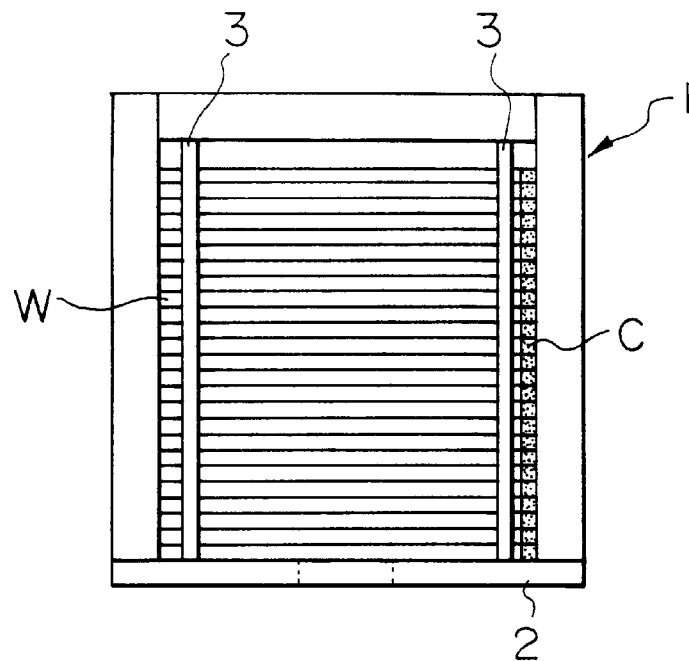
FIG. 2A is a side view of the carrier according to the first embodiment.
Figure 2B:
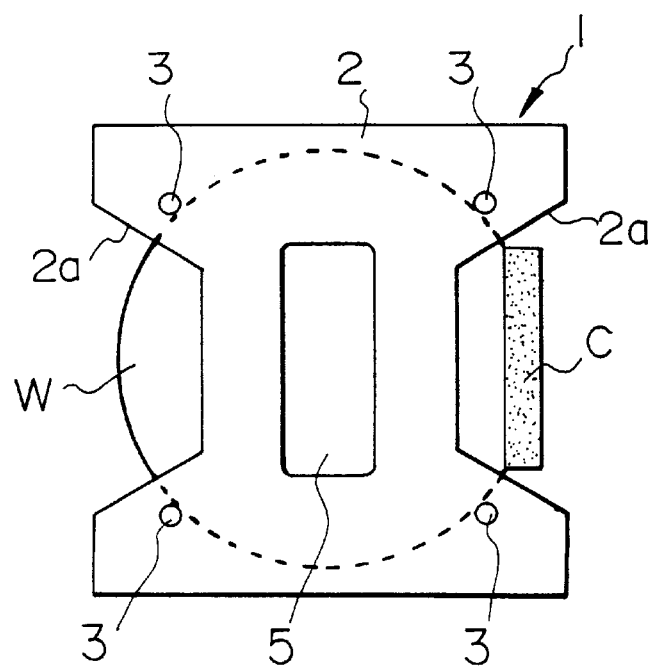
FIG. 2B is a bottom view of the carrier according to the first embodiment.
Figure 3:
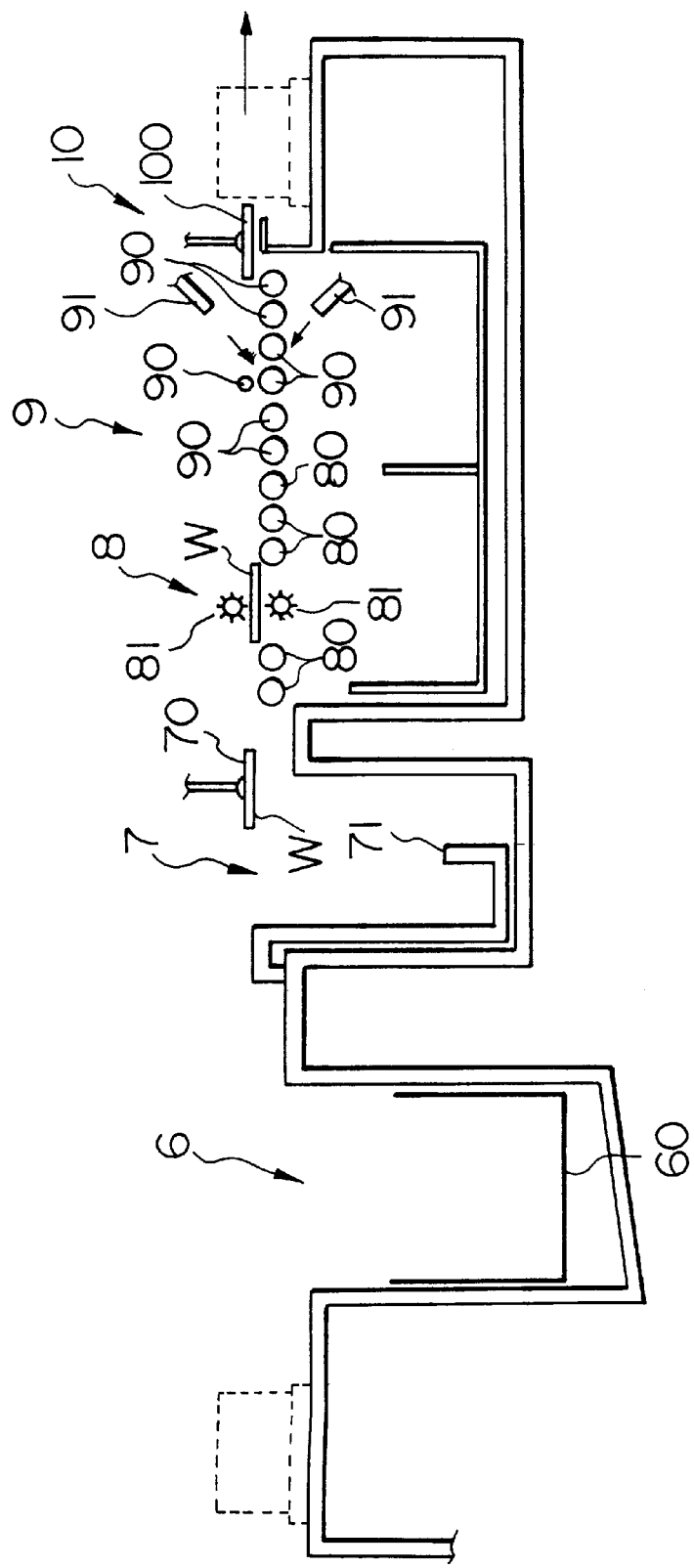
FIG. 3 is a schematic vertical sectional view of a system for carrying out the method of the present invention.
Figure 6:
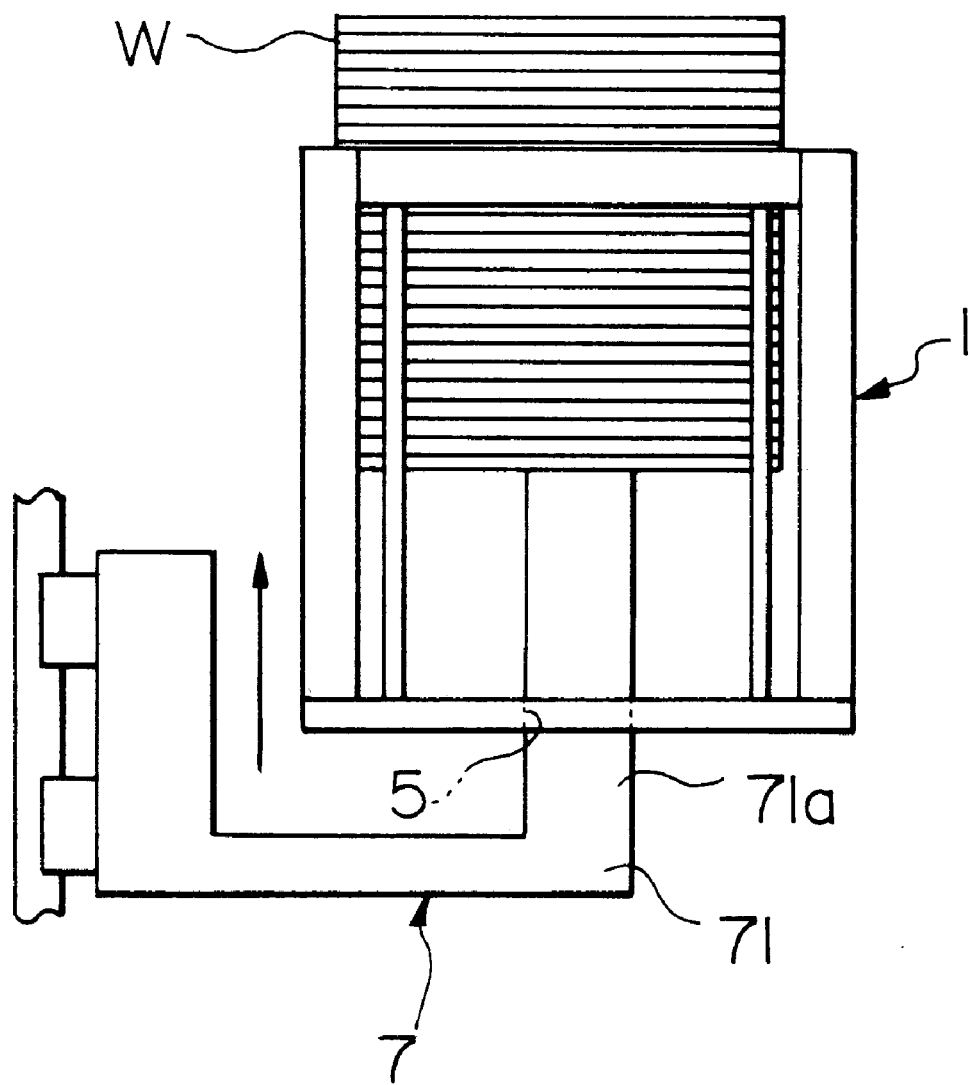
FIG. 6 is a schematic construction view of a loader of single wafer transfer type used in the method of the present invention.

The bottom plate 2 comprises an approximately square shaped plate a little larger than the wafer W and has two trapezoidal shaped cutouts 2a and 2a formed in two opposed sides thereof. A plurality of wafers W each of which has a slice base mounting member C, e.g., of carbon, cut apart from one another, can be stacked and supported on the bottom plate 2, as shown in FIG. 2A. When the wafers W are placed on the bottom plate 2, the wafers W are arranged so that the separated slice base mounting members C attached to the wafers are placed upon another in one of the cutouts 2a and 2a in plan, as shown in FIG. 2B. In the vicinity of the center portion of the bottom plate 2, a long rectangular shaped through hole 5 is formed so that the wafers W supported on the bottom plate 2 can be lifted up by inserting a taking-out device 71 having a shape complementary to that of the long hole 5, into the long hole upwardly, as shown in FIGS. 3 and 6.

The guide rods 3, 3, . . . are disposed at positions on the bottom plate 2, at which the guide rods are substantially in contact with the periphery of the wafers W supported on the bottom plate 2, that is, which are arranged on the circumference of a circle having a diameter slightly larger than that of the wafers W, as shown in FIG. 2B. The guide rods 3, 3, . . . perform a function of preventing sideslip of wafers W on the bottom plate 2 and another function of guiding the wafers W when the wafers W are stacked on the bottom plate 2. Each of the guide rods 3, 3, . . . has a male threaded portion (not shown) at a lower portion thereof. In the vicinity of each corner of the bottom plate 2, three threaded holes 20a, 20b, and 20c into which the male threaded portion of each guide rod 3 can be screwed, are formed at positions different distances apart from the center of the bottom plate 2 to one another. Selection of the threaded hole to be screwed depends on the diameter of the wafers W to be treated. A structure in which each guide rod 3 having no male threaded portion is inserted into one of holes provided in the bottom plate 2 and is fixed, can be also used.

Each handle 4 comprises a pair of vertical members 40 and 40 which are stood at the corners on the bottom plate 2, and a horizontal member 41 constructed between the upper portions of the pair of vertical members 40 and 40. A trapezoidal shaped cutout 41a is formed in the inner side of each horizontal member 41. Existence of the cutout 41a prevents the wafers W from interfering with each horizontal member 41 when the wafers W are placed on the bottom plate 2.

Although the heights of the handle 4 and 4 and of the guide rods 3, 3, . . . are not limited in particular, these heights are adapted to support about 500 stacked wafers W.

Next, a method according to a first embodiment of the present invention, for separating the slice base mounting members C which were completely separated to one another when an ingot was sliced, from the wafers W, will be explained.

First, a plurality of wafers W are placed in a stacked state on the bottom plate 2 of the carrier 1 by using the guide rods 3, 3, . . .

The carrier 1 is lifted by using the handles 4 and 4 and transferred to a separating position. The whole carrier 1 is immersed into a chemical liquid or the like of an adjusted temperature to separate the slice base mounting members C. Thereafter, the carrier 1 is taken out of the chemical liquid or the like. The wafers W supported on the bottom plate 2 are taken out of the carrier 1 in order from the top and the chemical liquid or the like is rinsed out of the wafers. Then, the wafers W are dried and stored in a predetermined carrier.

A system for carrying out the process is shown in FIG. 3. An outline of the system will be explained; as follows.

The system broadly comprises a separation apparatus 6, a loader 7 of single wafer transfer type, a cleaning apparatus 8, a drying apparatus 9, and an unloader 10.

Figure 4:
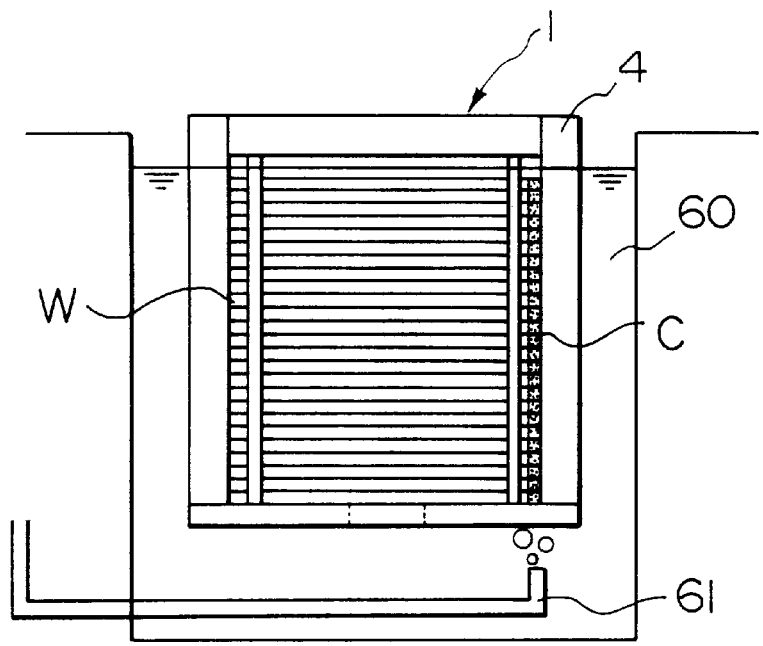
FIG. 4 is a schematic vertical sectional view showing a separation apparatus used in the first embodiment of the method of the present invention.

A separation tank 60 is provided in the separation apparatus 6. The separation tank 60 contains, for example, a chemical liquid, pure water, clean water or the like, of an adjusted temperature, as shown in FIG. 4. At a lower position in the separation tank 60, a nozzle 61 which is communicated with an air pump (not shown) is provided so that compressed air can be blown up from the top end of the nozzle 61. Supply of the compressed air gives an impact to an adhesive between the wafers W and the slice base mounting members C to separate the slice base mounting members C from the wafers W. Transfer of the carrier 1 to the separation tank 60 and taking-out of the carrier 1 from the separation tank 60 are carried out by using a transferring device (not shown) having a fork which can be inserted under the handles 4 and 4 and can pick up the handles 4 and 4.

The loader 7 of single wafer transfer type comprises a wafer suction device having a wafer suction disc 70, and a lifting device 71 having a taking-out jig 71a which can be inserted into the long hole 5 of the carrier 1 upwardly, as shown in FIGS. 3 and 6. The lifting device 71 has a function of pushing up the stacked wafers W by the thickness of a wafer W in regular succession. The wafer suction device has functions of sucking the top wafer of the stacked wafers W lifted by the lifting device 71 and of transferring it to the next cleaning apparatus 8.

The cleaning apparatus 8 comprises transferring rollers 80, 80, . . . for transferring the wafer W toward the drying apparatus 9, upper and lower rotary brushes 81 and 81 for cleaning the upper and lower surfaces of the wafer W, and a cleaning liquid supply device (not shown) for supplying a cleaning liquid. The rotary brushes 81 and 81 rotate in the same direction and thereby can clean even the front and rear ends of the wafer W.

The drying apparatus 9 comprises transferring rollers 90, 90, . . . for transferring the wafer W toward the unloader 10, and upper and lower air supply devices 91 and 91 for blowing a dry air to the upper and lower surfaces of the wafer W. The wafer W is dried by blowing the dry air to the upper and lower surfaces thereof.

The unloader 10 has a wafer suction device having a wafer suction disc 100, which sucks the dried wafer W and stores it in a predetermined carrier.

In this embodiment, because the separation treatment is carried out by using the carrier 1 supporting a plurality of stacked wafers W, instead of using a container in which the wafers W are arranged and stood in parallel, it is possible not to increase the installation area for the separation tank 60, to increase the number of wafers treated at a time, and to improve the throughput of the separation treatment.

Because the wafers W are supported in a stacked condition, the slice base mounting member C such as carbon which was separated from the wafer W does not get into the spaces between the wafers W, so that it is possible to prevent re-adhesion of the slice base mounting members C to the wafer surface. Therefore, the step of removing the re-adhered slice base mounting members is not required, lying idle of the apparatus caused by the step of removing disappears, and thus it is possible to improve the operating efficiency of the whole separating apparatus including the next cleaning apparatus 8.

In the embodiment, since the slice base mounting member C is separated by using an air bubbling, it is possible to surely separate the slice base mounting members C. Therefore, steps of ascertaining the separation thereof and of separating the remaining slice base mounting member by hand, are not required.

In the above embodiment, the slice base mounting member C which is separated by using a chemical liquid of an adjusted temperature as a separating liquid and by performing an air bubbling. However, hot water can be also used in place of the chemical liquid, and the following other means can be also used, instead of or together with the air bubbling.

Figure 5:
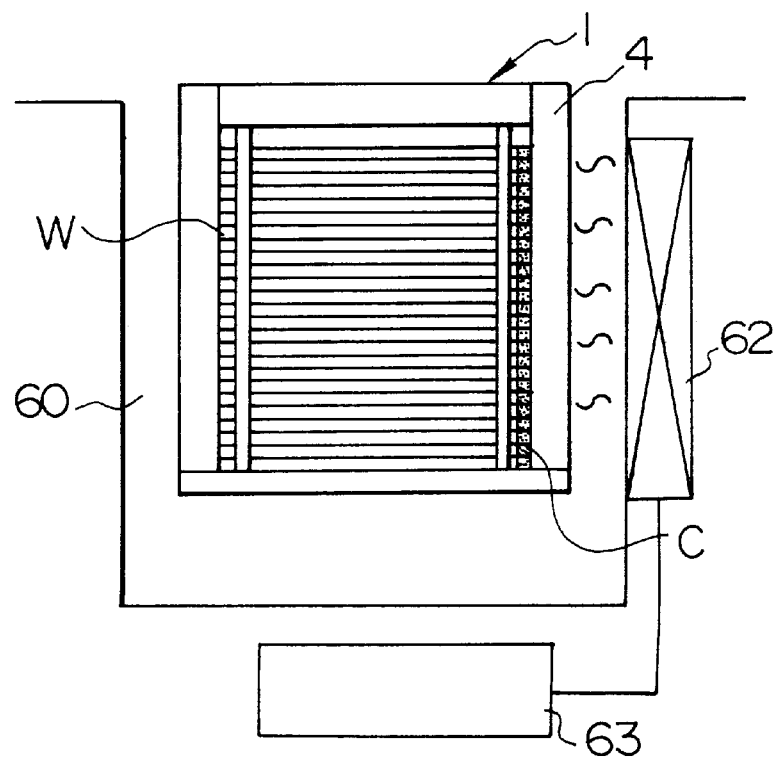
FIG. 5 is a schematic vertical sectional view showing a separation apparatus used in the second embodiment of the method of the present invention.

FIG. 5 shows the second embodiment of the method of separating a slice base mounting member from wafers according to the present invention. In this Figure, the separation tank 60 is provided with an ultrasonic wave vibrator 62 for applying an ultrasonic wave to the separating liquid, which is connected to an ultrasonic wave oscillator 63. The ultrasonic wave applied to the separating liquid gives an impact to the adhesive between the stacked wafers W and the slice base mounting member C to separate the slice base mounting member C from the wafers W. According to the second embodiment, instead of or together with the air bubbling of the first embodiment, it is possible to surely carry out the separation treatment of the slice base mounting member C in a shorter time.

Figure 7A:
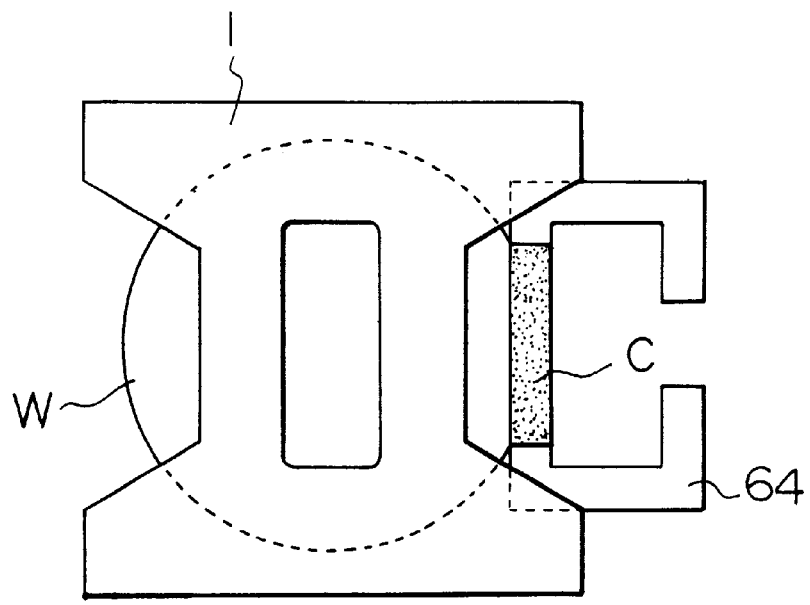
FIG. 7A is a schematic bottom view showing the third embodiment of the method of the present invention.
Figure 7B:
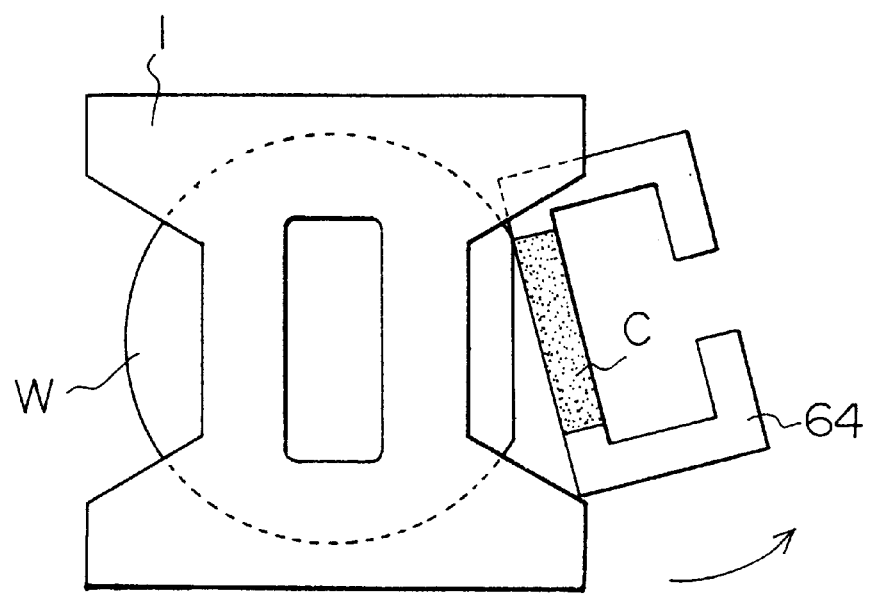
FIG. 7B is a schematic bottom view for explaining a manner of separation in the third embodiment of the method of the present invention.

FIGS. 7A and 7B show the third embodiment of the method of separating a slice base mounting member C from wafers according to the present invention.

First, a large number of wafers W, each of which has a separated slice base mounting member C, e.g., of carbon, are placed in a stacked state on the bottom plate 2 of the carrier 1 so that the slice base mounting members C are arranged in the same direction and adjacent wafer surfaces are in contact with each other.

Next, the carrier 1 containing a large number of wafers W is lifted and transferred to a separating position by using the handles 4 and 4, and the whole carrier 1 is immersed into a chemical liquid or the like. The entirety of the stacked slice base mounting members C is nipped by a nipping device 64 in a direction parallel to the wafer surfaces, as shown in FIG. 7A, and the entirety of the slice base mounting members C is stripped off in this direction, from the stacked wafers W, as shown in FIG. 7B. Thereafter, the carrier 1 containing stacked wafers W is taken out of the chemical liquid or the like, and the wafers W supported on the bottom plate 2 are taken out of the carrier 1 in order from the top and the wafers stained with the chemical liquid or the like is rinsed, in a manner similar to the first embodiment.

In the third embodiment, because the slice base mounting members C are compulsorily separated, it is possible to increase the number of wafers treated per unit time, and to improve the throughput of the separation treatment. It is also possible to suppress the increase in installation area for the separation tank 60. Because the plurality of wafers W are stacked so that the slice base mounting members C are arranged in the same direction and adjacent wafer surfaces are in contact with each other, the separated slice base mounting members C does not adhere onto the wafer surfaces again.

In this embodiment, because the slice base mounting members C are separated in a direction parallel to the wafer surfaces, not perpendicular to the wafer surfaces, it is possible to prevent edges of wafers W from chipping.

Figure 8A:
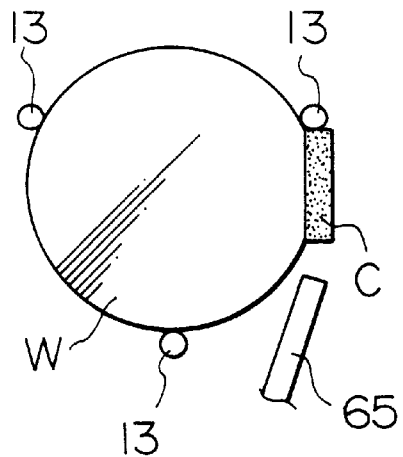
FIG. 8A is a schematic plan view showing the fourth embodiment according to the method of the present invention.
Figure 8B:
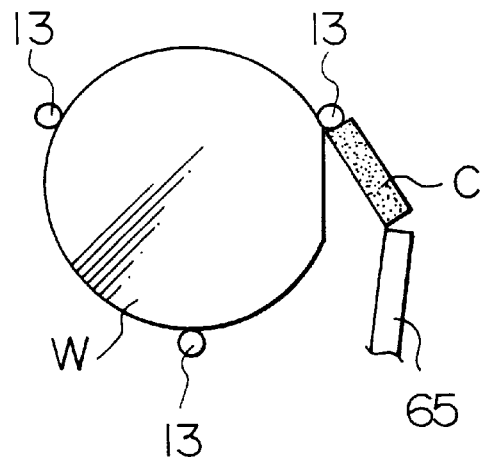
FIG. 8B is a schematic plan view for explaining a manner of separation in the fourth embodiment of the separation method of the present invention.
Figure 9:
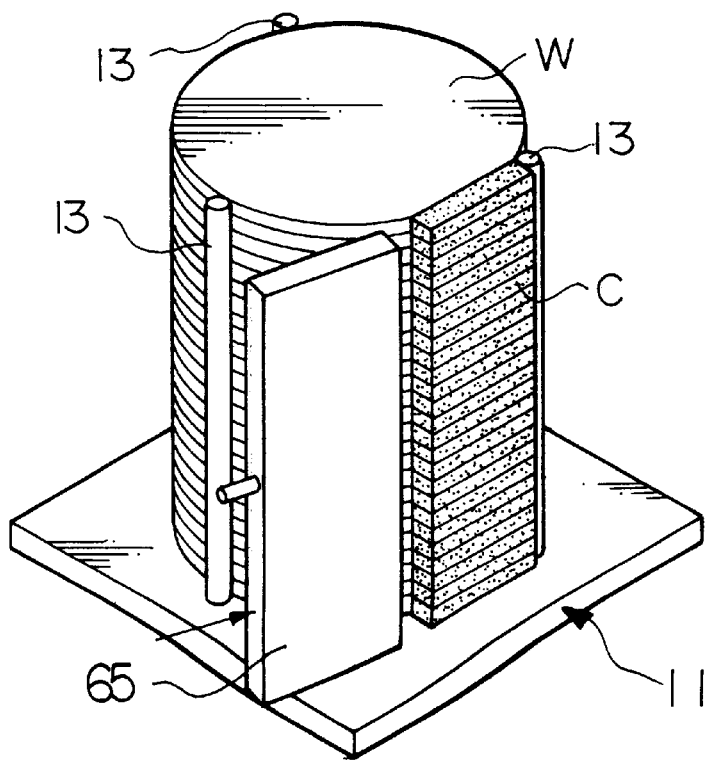
FIG. 9 is a perspective view of a pushing and stripping member and the like used in the fourth embodiment of the method of the present invention.

FIGS. 8A, 8B and 9 show a fourth embodiment of the method of the present invention, for separating slice base mounting members C which were completely separated to one another when an ingot was sliced, from the wafers W.

In this embodiment, a large number of wafers W having separated slice base mounting members C, e.g., of carbon, are taken in a carrier 11, i.e., a wafer treating jig, in a stacked state so that the slice base mounting members C are arranged in the same direction and adjacent wafer surfaces are in contact with each other, as shown in FIG. 9. In this embodiment, a pushing and stripping member 65 which can push a side surface of the entirety of the stacked slice base mounting members C and is movable in a horizontal direction shown by an arrow in FIG. 9, is prepared. After these wafers W with separated slice base mounting members C are immersed into a chemical liquid or the like in the separation tank 60, a side surface of the entirety of the stacked slice base mounting members C is pressed by the pushing and stripping member 65, i.e., a pressing device, while placing the opposite side surface of the stacked slice base mounting members C against one of columns 13, i.e., a fixed portion, mounted on the carrier 11, as shown in FIG. 8A. Consequently, the entirety of the stacked slice base mounting members C are chemically and mechanically stripped from the wafers W, as shown in FIG. 8B. In FIG. 9, handles of the carrier 11 are omitted.

According to this embodiment, it is possible to obtain the same advantageous effects as those of the first embodiment.

FIGS. 10A, 10B and 11 show a fifth embodiment of the method of the present invention, for separating slice base mounting members C which were completely separated to one another when an ingot was sliced, from the wafers W.

In this embodiment, a large number of wafers W having separated slice base mounting members C such as carbon members, are taken in a carrier 11, i.e., a wafer treating jig, in a stacked state so that the slice base mounting members C are arranged in the same direction and adjacent wafer surfaces are in contact with each other, as shown in FIG. 11. In this embodiment, a pulling and stripping member 66 which can pull a side surface of the entirety of the stacked slice base mounting members C and is movable in a horizontal direction, is prepared. After these wafers W with separated slice base mounting members C are immersed into a chemical liquid or the like in the separation tank 60, a side surface of the entirety of the stacked slice base mounting members C is pressed by the pulling and stripping member 66, i.e., a pressing device, while placing the opposite side surface of the stacked slice base mounting members C against one of columns 13, i.e., the fixed portion, mounted on the carrier 11, as shown in FIG. 10A. Consequently, the entirety of the stacked slice base mounting members C are chemically and mechanically stripped from the wafers W, as shown in FIG. 10B. In FIG. 11 also, handles of the carrier 11 are omitted.

According to this embodiment, it is also possible to obtain the same advantageous effects as those of the first embodiment.

Figure 12A:
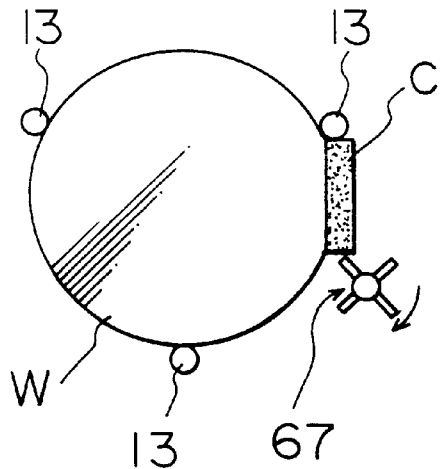
FIG. 12A is a schematic plan view showing the sixth embodiment of the method of the present invention.
Figure 12B:
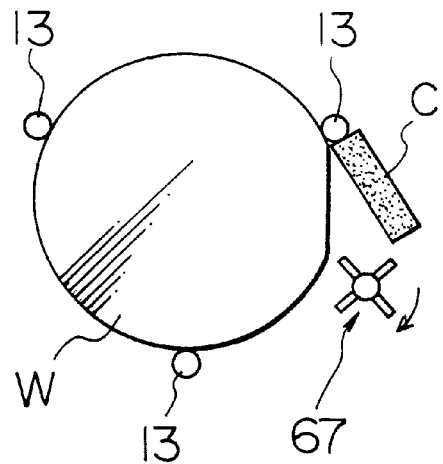
FIG. 12B is a schematic plan view for explaining a manner of separation in the sixth embodiment of the method of the present invention.
Figure 13:
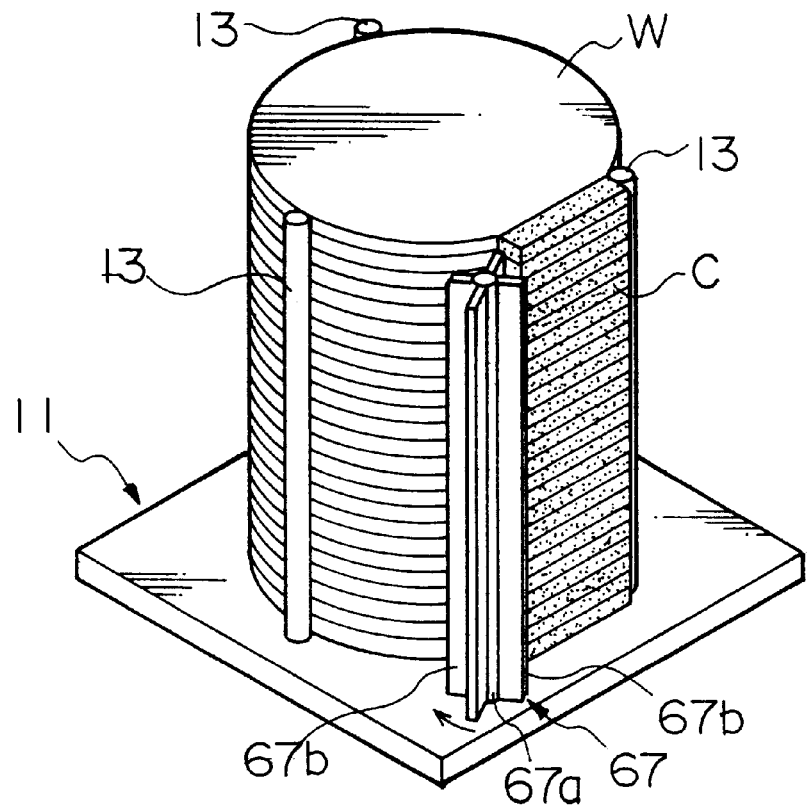
FIG. 13 is a perspective view of a rotary member and the like used in the sixth embodiment of the method of the present invention.
Figure 14:
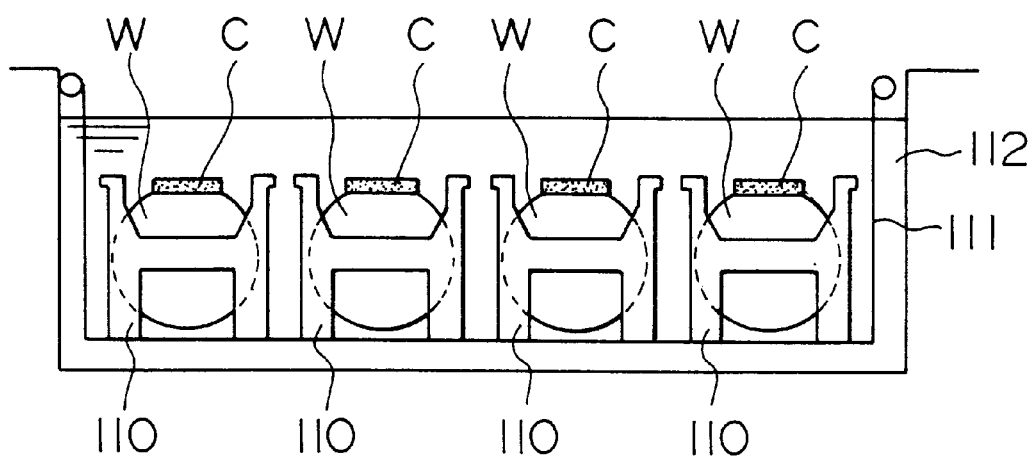
FIG. 14 is a view for explaining a conventional separating method.

FIGS. 12A, 12B and 13 show a sixth embodiment of the method of the present invention, for separating slice base mounting members C which were completely separated to one another when an ingot was sliced, from the wafers W.

In this method, a large number of wafers W having separated slice base mounting members C such as carbon members, are taken in a carrier 11, i.e., a wafer treating jig, in a stacked state so that the slice base mounting members C are arranged in the same direction and adjacent wafer surfaces are in contact with each other, as shown in FIG. 13. In this embodiment, a rotary member 67 which is rotatable in a direction shown by an arrow in FIG. 13 by a motor or the like, to push a side surface of the entirety of the stacked slice base mounting members C in a horizontal direction, is prepared. After these wafers W with separated slice base mounting members C are immersed into a chemical liquid or the like in the separation tank 60, a side surface of the stacked slice base mounting members C is repeatedly pressed by the rotation of elastic vanes 67b attached to a shaft 67a of the rotary member 67, i.e., a pressing device, while placing the opposite side surface of the stacked slice base mounting members C against one of columns 13, i.e., the fixed portion, mounted on the carrier 11, as shown in FIG. 12A. Consequently, the entirety of the stacked slice base mounting members C are chemically and mechanically stripped from the wafers W, as shown in FIG. 12B. The elastic vanes 67b of the rotary member 67 are made of silicone rubber or the like and are properly divided in an axial direction. In FIG. 13 also, handles of the carrier 11 are omitted.

According to this embodiment, it is also possible to obtain the same advantageous effects as those of the first embodiment.

Although the present invention has been described in its preferred forms which were carried out by the inventors, it should also be understood that the present invention is not limited to the preferred embodiments and that various changes may be made to the invention without departing from the spirit and scope thereof.

In the above-described embodiments, the method for separating the slice base mounting member C from the wafers according to the present invention is applied for only stacked wafers W having a plurality of slice base mounting members C which were completely separated to one another when an ingot was sliced. However, the method of the present invention can be also applied for the wafers W which are connected with one another through the slice base mounting member C which has been incompletely cut when an ingot was sliced.

In each of the above-described embodiments, the composition, the temperature and the like of the separating liquid in which the wafers W with slice base mounting members C are immersed, the immersing time of the wafers W in the separating liquid, the time and the air flow rate of the air bubbling, and the like may be suitably determined. For example, water such as pure water or clean water, an acetic acid aqueous solution having a concentration of about 10%, or the like can be used as the separating liquid. The temperature of the separating liquid and the immersing time of the wafers W therein are preferably in the ranges of 85±5° C. and of 20–30 minutes, respectively. The air flow rate of the air bubbling may be in the range of 40–50 liter/min. Although the air bubbling may be carried out all during immersing the wafers, it may be also carried out only for about last 5 minutes.

Further, the direction for separating the slice base mounting members C may not be one departing from the orientation flat of the wafer, and may be one parallel to the orientation flat.

As described above, according to the present invention, it is possible to increase the number of wafers treated per unit time and to improve the throughput of the separation treatment. It is also possible to suppress the increase in installation area for the separation tank. Further, the separated slice base mounting member C of carbon or the like does not adhere onto the wafer surfaces again. It is also possible to suppress the increase in installation area for the separation tank.

What is claimed is:

1. A method of separating a slice base mounting member from sliced wafers, comprising:

supporting a plurality of wafers having at least one slice base mounting member in a stacked state in which the wafers overlie each other and adjacent wafer surfaces are in contact with each other; and separating the slice base mounting member from the stacked wafers.

2. A method of separating a slice base mounting member as claimed in claim 1, wherein the slice base mounting member comprises carbon.

3. A method of separating a slice base mounting member as claimed in claim 1, wherein each of the stacked wafers includes a slice base mounting member, and each of the slice base mounting members being arranged in substantially the same direction.

4. A method of separating a slice base mounting member as claimed in claim 1, further comprising immersing the supported and stacked wafers in a separating liquid.

5. A method of separating a slice base mounting member as claimed in claim 4, further comprising impacting an adhesive disposed between the wafers and the slice base mounting member by supplying compressed air in the separating liquid, so as to separate the slice base mounting member from the wafers.

6. A method of separating a slice base mounting member as claimed in claim 4, further comprising impacting an adhesive disposed between the wafers and the slice base mounting member by applying ultrasonic waves to the separating liquid, so as to separate the slice base mounting member from the wafers.

7. A method of separating a slice base mounting member as claimed in claim 4, further comprising:

nipping the slice base mounting member using a nipping device; and moving the nipping device with the slice base mounting member so as to separate the slice base mounting member from the wafers.

8. A method of separating a slice base mounting member as claimed in claim 4, further comprising:

pressing a first side surface of the slice base mounting member using a pressing device while placing a second side surface of the slice base mounting member opposite to the first side surface against a fixed portion; and moving the slice base mounting member so as to separate the slice base mounting member from the wafers.

9. A method of separating a slice base mounting member as claimed in claim 4, further comprising:

removing the stacked wafers from the separating liquid separating the slice base mounting member from the wafers;

transferring the removed wafers to a cleaning apparatus one by one;

cleaning the transferred wafers in the cleaning apparatus one by one; and drying the cleaned wafers.

10. A method of separating a slice base mounting member as claimed in claim 9, wherein the stacked wafers removed from the separating liquid are transferred one by one by a suction device which can suck to support a top one of the stacked wafers on a lower surface of the suction device.

11. A method of separating a slice base mounting member as claimed in claim 1, wherein the plurality of supported wafers include a plurality of slice base mounting members and are stacked so that the slice base mounting members that are separated from one another are arranged in the same direction and the method further comprising:

nipping each of the slice base mounting members by a nipping device; and moving the nipping device with the slice base mounting members so as to separate the slice base mounting members from the wafers.

12. A method of separating a slice base mounting member as claimed in claim 1, wherein the plurality of supported wafers includes a plurality of the slice base mounting members and the supported wafers are stacked so that the slice base mounting members that are separated from one another are arranged in the same direction, and the method further comprising:

pressing a first side surface of the slice base mounting members using a pressing device while placing a second side surface of the slice base mounting members opposite to the first side surface against a fixed portion; and moving the slice base mounting members so as to separate the slice base mounting members from the wafers.

13. A method of separating a slice base mounting member as claimed in claim 1, wherein the plurality of supported wafers are connected with one another through the slice base mounting member, and the method further comprising:

nipping the slice base mounting member by a nipping device; and moving the nipping device with the slice base mounting member so as to separate the slice base mounting member from the wafers.

14. A method of separating a slice base mounting member as claimed in claim 1, wherein the plurality of supported wafers are connected with one another through the slice base mounting member and the method further comprising:

pressing a first side surface of the slice base mounting member using a pressing device while placing a second side surface of the slice base mounting member opposite to the first side surface against a fixed portion; and moving the slice base mounting member so as to separate the slice base mounting member from the wafers.

15. A method of separating a slice base mounting member from sliced wafers, comprising:

providing a jig for treating wafers that separates a slice base mounting member from sliced wafers, the jig comprising a bottom plate on which a plurality of wafers having a diameter are supportable in a stacked state, an upstanding guide means on the bottom plate for guiding the wafers in the stacked state, and a handle attached to the bottom plate;

supporting a plurality of wafers including at least one slice base mounting member on the bottom plate of the jig, the wafers being supported in the stacked state such that the slice base mounting member is disposed in the cutout of the bottom plate; and separating the slice base mounting member disposed in the cutout from the stacked wafers using a separating means.

16. An apparatus for separating a slice base mounting member from sliced wafers, comprising:

means for supporting a plurality of wafers having at least one slice base mounting member in a stacked state in which the wafers overlie each other and adjacent wafer surfaces are in contact with each other; and means for separating the slice base mounting member from the stacked wafers.

* * * * *